US005758056A

United States Patent [19]
Barr

[11] Patent Number: 5,758,056
[45] Date of Patent: May 26, 1998

[54] MEMORY SYSTEM HAVING DEFECTIVE ADDRESS IDENTIFICATION AND REPLACEMENT

[76] Inventor: Robert C. Barr, 925 Brush Hill Rd., Thousand Oaks, Calif. 91360

[21] Appl. No.: 598,464

[22] Filed: Feb. 8, 1996

[51] Int. Cl.$^6$ .................................................. G06F 11/00
[52] U.S. Cl. ................................ 395/182.05; 371/10.2
[58] Field of Search ................................ 395/180, 181, 395/182.01, 182.03, 182.04, 182.05; 371/7, 8.1, 10.2, 10.3; 365/200, 201

[56] References Cited

U.S. PATENT DOCUMENTS

| | | | |
|---|---|---|---|
| 4,066,880 | 1/1978 | Salley | 365/200 |
| 4,089,063 | 5/1978 | Takezono et al. | 365/200 |
| 4,380,066 | 4/1983 | Spencer et al. | 371/10 |
| 4,426,688 | 1/1984 | Moxley | 365/200 |
| 4,511,964 | 4/1985 | Georg et al. | 364/200 |
| 4,523,313 | 6/1985 | Nibley et al. | 371/10 |
| 4,527,251 | 7/1985 | Nibley et al. | 364/900 |
| 4,654,847 | 3/1987 | Dutton | 371/10 |
| 4,757,474 | 7/1988 | Fukushi et al. | 365/189 |
| 5,289,416 | 2/1994 | Iwai et al. | 365/200 |
| 5,315,552 | 5/1994 | Yoneda | 365/200 |
| 5,357,473 | 10/1994 | Mizuno et al. | 365/201 |
| 5,539,697 | 7/1996 | Kim et al. | 365/200 |

Primary Examiner—Albert Decady
Attorney, Agent, or Firm—Fillmore, Belliston & Israelsen, LC; Angus C. Fox, III

[57] ABSTRACT

The present invention is embodied in a memory system which restores full functionality to a dynamic random access main memory having at least one defective bit. In a preferred embodiment of the invention, the memory system is integrated on an industry standard memory module which is plugged into a host computer system. The memory module incorporates a block of DRAM main memory, an SRAM replacement memory, a non-volatile memory which stores a map of defective memory locations within the main memory, and a process control module (PCM) operable in multiple modes, which manages a defective address identification and replacement process. The PCM, which contains high-speed registers, in addition to decoding and control logic, is implemented as a high-speed application-specific integrated circuit (ASIC). The PCM, which is coupled to both the host system memory address and data buses, recognizes addresses of defective memory locations within the main memory block and, in response to such recognition, suppresses output from the main memory block and provides a replacement address within the high-speed SRAM memory. The data stored at the replacement address is output to the system data bus. The process operates with sufficient speed to ensure that there is no degradation in main memory access time. The non-volatile memory can be updated by the host system to correct newly discovered defects in the main memory without removing the memory module from the system.

44 Claims, 11 Drawing Sheets

MEMORY SYSTEM HAVING DEFECTIVE ADDRESS IDENTIFICATION AND REPLACEMENT

BACKGROUND OF THE INVENTION

1. Field of the Invention

This invention generally relates to digital memory systems for use in conjunction with a central processing unit and, more particularly, to memory systems constructed from partially defective integrated memory circuits.

2. Description of Related Art

A traditional computer memory hierarchy has developed as a consequence of the relative price and performance characteristics of available technologies. The fastest and most expensive memories are constructed from static random access memory (SRAM) chips; those constructed from dynamic access memory (DRAM) chips are somewhat slower, but less expensive because of their greater density. Rotating magnetic media-based memory is dramatically slower than either of the aforementioned semiconductor-based memories, but its speed disadvantage is offset by a much lower cost per megabyte. Magnetic tape storage, which is far slower and considerably less expensive than rotating magnetic media-based memory, is at the bottom of the traditional memory hierarchy. As optical storage technology becomes more sophisticated and less costly, it may increasingly supplant sequentially-accessed magnetic storage.

As refinements of semiconductor manufacturing technology have simultaneously reduced the unit cost and increased the density of semiconductor memory, such memory has been used with increasing frequency in applications that were once the domain of rigid disk drives. In the late 1980s, it was noted that if the price curves for semiconductor memory and rigid disk drives were extended into the future, a crossover point would occur sometime between the mid-1990s and the year 2000, at which time the cost per bit of semiconductor storage would be less than that of rigid disk storage. This has not occurred. In fact, the cost per megabyte of semiconductor storage has hovered around $30 for the last five years, while the cost of rigid disk storage has fallen to $0.20 per megabyte.

Semiconductor memory configuration is highly application dependent. Large, high-speed semiconductor memories are essential for applications such as design automation, seismic data processing, weather forecasting, scientific simulation, artificial intelligence, graphics imaging and animation. The incorporation of virtual reality in games and other graphics applications aimed at consumers will also require vast amounts of high-speed semiconductor memories. However, such applications for the home market will probably not be supplied in any significant quantities until the cost of semiconductor memory falls to the point where the masses are willing to purchase scores of megabytes.

The relatively stable price per bit of semiconductor memory may be related to the semiconductor industry's inability to satisfy—at least in the short term—an unexpected increase in demand for such memory that has been driven by inefficiently-written, memory-hungry operating systems and application software. It may also be related to the increasing complexity of the processes used in its manufacture. Given both the complexity of the process and the enormous number of circuit components in a single memory chip, it is little wonder that full-specification memory chips having no defective memory locations (i.e., bad bits) are scarce at the 4-megabit level, and scarcer still at the 16-megabit level of integration. At the 64-megabit level and beyond, they are expected to be rare indeed.

Fortunately, contemporary memory chips are designed so that defective memory locations can be replaced with functional ones. Row and column addressable memory arrays are generally provided with both spare rows and spare columns. By reconfiguring circuit elements on the chip either by blowing a particular combination of fuses or by fusing a particular combination of antifuses, the address of a row or column containing one or more defective storage locations can be permanently rerouted to a spare row or column. Although overhead, such as additional gate delays associated with the address rerouting, does increase the access time of the memory device, the small reduction in device speed is outweighed by the restoration to full functionality.

One of the costs associated with the provision of spare rows and columns is a reduction in the number of chips on a wafer. This mandates that a balance be struck between the cost of providing redundancy and the cost related to the loss of die candidates which are not fully repairable because of inadequate redundancy. Consequently, many chips on a wafer will contain more rows or columns with bad bits than there are spare rows or columns available. These memory chips which are not fully repairable are worth far less than perfect or repaired chips. Although memory systems constructed from memory chips which are not fully repairable can provide reliable data storage if an error correction system is implemented to correct defective data, the increased processor overhead, decreased system speed and additional memory burden associated with error correction systems makes the use of less than full specification semiconductor chips in main memory applications undesirable. By full specification, it is meant that the chips are free of hard errors and demonstrate an acceptable soft error rate.

Many applications exist where absolute accuracy of data is not required. Memory chips which are not fully repairable have found wide use as "audio RAMs". Audio RAMs are used to store digitized sound in applications such as telephone answering machine memories, where the existence of a small percentage of bad bits will not perceptibly change the quality of the sound. Audio RAMs sell for about one-tenth the price of fully functional chips. If the chips have too many bad bits to be useful as audio RAMs, they are simply ground up and discarded.

In U.S. Pat. No. 5,315,552 entitled "MEMORY MODULE, METHOD FOR CONTROL THEREOF AND METHOD FOR SETTING FAULT BIT TABLE FOR USE THEREWITH", a memory module having a fault bit substituting device that compensates for fault bits detected in any of the memory chips on the module is disclosed. The specification states that the preferred fault substituting means comprises a fault address coincidence circuit for detecting access to a fault bit using a fault bit table, a fault bit substitute memory, and a selection control circuit for suppressing the output of the normal memory and selecting a substitute address within the fault bit substitute memory if the fault address coincidence circuit detects access to a fault bit. It is suggested that the fault bit table might be stored within a field programmable memory, a field programmable logic array (FPLA), or a random access memory. Other than stating that the fault address coincidence circuit might be constructed from an FPLA, no other guidance is given. If a memory module were to be manufactured in accordance with the guidance given in the above-referenced patent, certain modes of memory access (e.g., DRAM fast page mode access) may fail because of speed issues. If a bit substitution scheme is to function without slowing memory access, design of the fault address coincidence circuitry is crucial. The referenced patent also states that the fault bit table might be updated following installation of the memory in a host computer system. Yet, there is no guidance as to how the host CPU might communicate and update the table. This is no trivial task if memory system compatibility is an issue, as there are millions upon millions of computers in existence which have memory module sockets which interface to only an address bus, a data bus, control lines and power.

SUMMARY OF THE INVENTION

The present invention includes a new memory system, which implements a defective address identification and replacement (DAIR) scheme to restore full functionality to a row and column addressable semiconductor main memory block having one or more defective bits with no reduction in operational speed of the memory. The new memory system can be used in place of, or in conjunction with, the conventional row and column substitution techniques heretofore described. Full functionality is restored to the main memory block by substituting functional bits within a higher speed semiconductor replacement memory for defective bits within the main memory.

In a preferred embodiment of the invention, the new memory system works in conjunction with the central processing unit (CPU) and memory management unit (MMU) of a host computer system. The new memory system is most easily integrated on a memory module such as the industry standard Single In-line Memory Module (SIMM) or Dual In-line Memory Module (DIMM). Typically, multiple modules, each containing a block of memory, are plugged into sockets on a computer motherboard and constitute the computer system's main memory. For a memory module fabricated in accordance with the present invention, each module incorporates a block of main memory having one or more row and column addressable semiconductor memory chips; a replacement memory having at least one semiconductor memory chip which preferably has a shorter access time than the main memory chips; a non-volatile memory for storing a map of defective memory locations within the DRAM memory; and a Process Control Module (PCM) which controls the DAIR process. The PCM, which contains decoding and control logic, in addition to high-speed registers which are loaded with the map data from the non-volatile memory, is implemented as a High-speed Application-Specific Integrated Circuit (ASIC). The PCM is coupled to both the host system memory address bus and the host system data bus. When the PCM registers are loaded and the PCM is in Active Mode, the PCM recognizes the addresses of defective memory locations in the module's main memory block and, in response to such recognition, suppresses output from that block and provides a replacement address within the higher-speed replacement memory which it assembles from the incoming addresses and the number of the register or registers which contain the map data for the particular defective main memory location. The data stored at the replacement address is output to the system data bus.

Following assembly of a memory module in accordance with the preferred embodiment of the invention, the module is connected to a tester, which commands the PCM to enter a Test Mode. In this mode the PCM is inactive, thus allowing the tester to perform a standard memory test on the module's main memory. The tester collects all failure information from the module and analyzes the data. The tester software identifies row failures, column failures, and random location failures in the main memory and generates a file of binary data which identifies each failure location and the failure mode (i.e., whether column, row or random failure). The tester then commands the PCM to enter a Write Mode. The tester then generates an appropriate number of write cycles (one for each byte of binary data within the data file), which transfer the map data file byte-by-byte to the PCM. The PCM responds to each write cycle of the tester by generating a write cycle of its own, which transfers each byte in sequence to the non-volatile memory. Write Mode concludes when the non-volatile memory has been completely programmed with the map data.

On detecting a power-up condition at system start-up, the PCM sets itself to Upload Mode and loads the map data from the non-volatile memory into its high-speed registers. Following loading of the registers, the PCM sets itself to Active Mode. In Active Mode, the PCM analyzes each memory address issued by the MMU in response to an issued CPU memory address. The MMU generates RAS and CAS signals and a multiplexed (row and column) address consistent with a particular main memory configuration. Only when a main memory address corresponding to a defective storage location in the DRAM memory is issued by the MMU, does the PCM intervene by decoupling the DRAM memory from the system data bus and generating a replacement address within the replacement memory. The contents of the replacement address is then output to the system data bus.

If a newly defective memory location is recognized at system start-up during a routine system memory test, a special software test program is run which places the PCM in Maintenance Mode. In Maintenance Mode, the host CPU is able to write additional data to the non-volatile memory which identifies the newly found defective memory locations in the main memory. When the non-volatile memory update is complete, the special test program places the PCM in Upload Mode so that the PCM can load the updated map data into its registers. When the upload is complete, the PCM returns to Active Mode, being ready to accept and analyze addresses issued by the MMU. Thus, repair of a defective memory location may be accomplished without removing the memory module from the host computer system.

PREFERRED EMBODIMENT OF THE INVENTION

The new memory system, which implements a defective address identification and replacement (DAIR) scheme, is implemented in conjunction with a main memory block of a given size, configuration and known defect level. Although the invention is disclosed herein in terms of a main memory comprising dynamic random access memory (DRAM) devices and a replacement memory comprising of static random access memory (SRAM) devices, substitution of other types of memory devices, such as SRAM devices, flash memory devices, or ferroelectric memory devices for the DRAM devices is also contemplated. Other types of memory devices may also be substituted for the SRAM replacement memory devices. Furthermore, though the invention may be implemented as an add-on subsystem that is physically separate from the main memory (such an implementation may be suitable for use in conjunction with a mainframe computer system), it is most easily incorporated in memory subsystem such as a memory module which incorporates at least one row and column addressable memory device. Incorporation of the system on a memory module affords the following advantages: (1) memory system testing may be performed independent of the host computer system; (2) circuitry and control logic is simplified, as the memory configuration on the module is constant; and (3) memory system components may be selected which are of optimum capacity for a given defect level. For these reasons, the invention will now be described in terms of its incorporation on an industry standard memory module of the type used in Intel microprocessor-based personal computers, as such computers presently absorb most of the world's output of memory chips. As dynamic random access memory (DRAM) devices are typically used for most main memory applications, the new memory system will be described in terms of its application to a DRAM main memory. However, by no means is practice of the invention limited to DRAM main memory, Intel microprocessor-based personal computers or memory modules.

Figure 1:
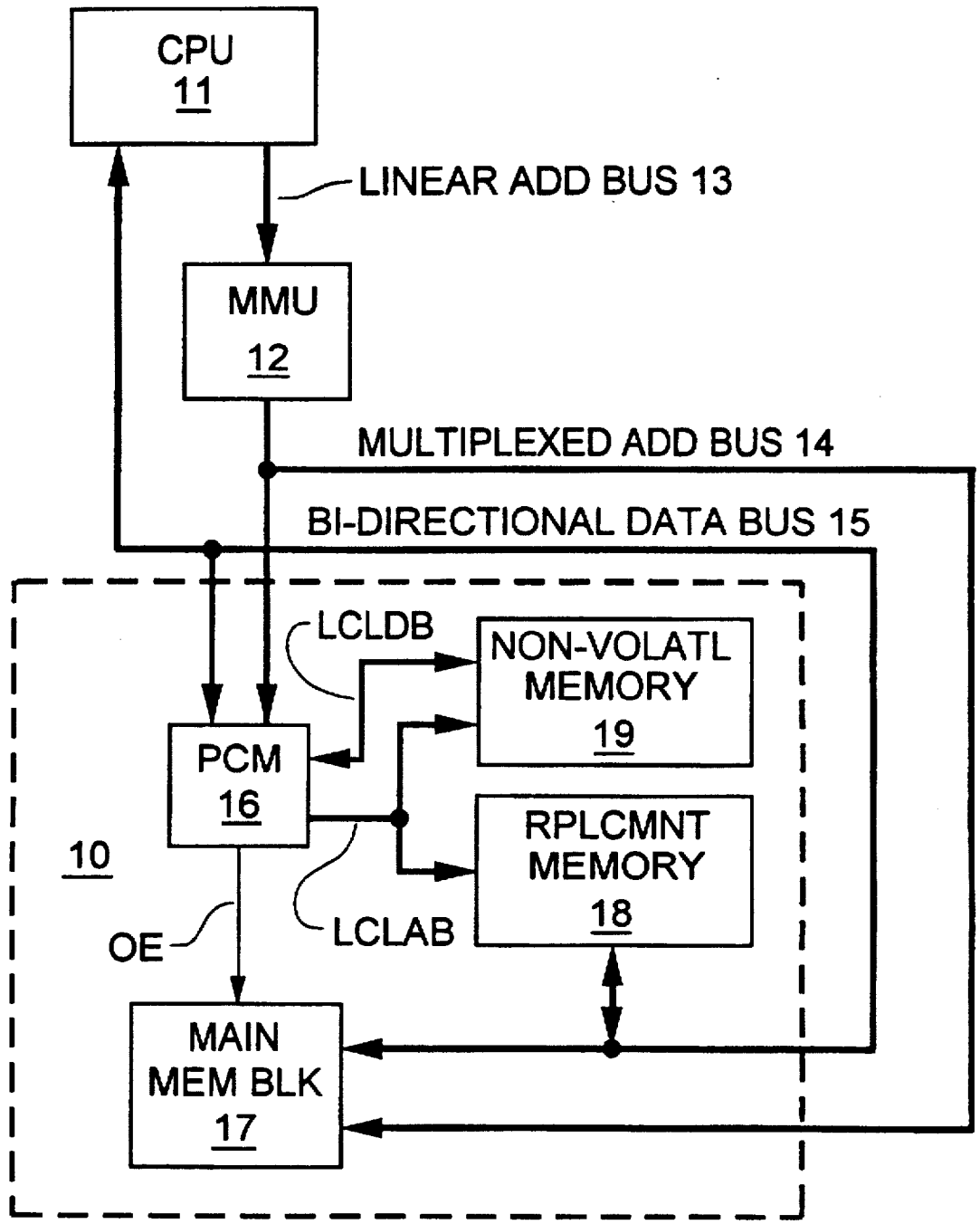
FIG. 1 is a block diagram of the new memory system.

Referring now to FIG. 1, a preferred embodiment of the new memory system incorporating the DAIR scheme is implemented as a memory module 10 within a host computer system having a host central processor unit (CPU) 11; a memory management unit 12 that is coupled to the CPU 11 via a linear address bus 13; a multiplexed system memory address bus 14; and a bi-directional data bus 15. The memory module 10 incorporates a process control module (PCM) 16, a block of row and column addressable DRAM main memory 17, a replacement SRAM memory 18, and a non-volatile memory 19. The PCM 16 is coupled to the bi-directional data bus 15, to the multiplexed address bus 14, to the block of main memory 17 via output enable control lines OE, to the replacement memory 18 via a local address bus LCLAB, and to the non-volatile memory 19 via both the local address bus LCLAB and a local data bus LCLDB. The main memory block 17 is also coupled to both the bi-directional data bus 15 and the multiplexed address bus 14. The replacement memory is coupled to the bi-directional data bus 15, but is not directly coupled to the multiplexed address bus 14.

Still referring to FIG. 1, the non-volatile memory 19 serves as a storage location for binary coded information which identifies the addresses of defective memory locations within the main memory block 17 and other data which defines the failure mode at each defective location (i.e., whether each defective address is the beginning address for a defective row, the beginning address for a defective column, or a multiplexed address corresponding to a random defective main memory address). The non-volatile memory 19, in essence, contains a map of defective memory locations in the main memory block 17. The map is most conveniently stored in a non-volatile memory so that it is retained when the computer system is powered down. Otherwise, the testing and mapping of defective memory locations in the main memory block 17 would have to be performed at every power-up condition. The non-volatile memory 19 is preferably an electrically programmable memory such as an Electrically Erasable and Programmable Read Only Memory (EEPROM) device or a flash memory. The major difference between the two memory types is that memory cells in a flash memory are not individually erasable; rather, they must be erased in blocks. This disadvantage is offset by the advantage of greater density and lower cost. A less desirable alternative to either a EEPROM or flash memory device would be a static random access memory (SRAM) device with battery backup for non-volatility.

For the sake of linguistic simplicity, defective storage locations within the main memory are referred to as "defective main memory addresses". By the use of this descriptive phrase, it is not to be implied that addressability is impaired at a particular memory address or series of main memory addresses, but rather read and write unreliability at the particular address or series of addresses.

The replacement memory 18 is preferably implemented with at least one high-speed SRAM device. For what is deemed a preferred implementation of the invention, memory locations within the SRAM device are organized so that they are addressable as 32-bit words. Thus, regions within the main memory 17 having one or more defective bits are replaced in 32-bit blocks, each of which is addressable as a 32-bit word in the replacement memory 18.

The fundamental operations of the memory module 10 can be defined in terms of five mutually exclusive modes in which the PCM 16 is operable. Those various modes will now be described.

A memory module 10, assembled with the components identified in FIG. 1, is connected to a tester, which commands the Process Control Module (PCM) 16 to enter Test Mode. In this mode, the PCM 16 is inactive, thus allowing the tester to perform a standard memory test on the DRAM main memory block 17. The tester collects and analyzes all failure data related to the main memory block 17. The tester software identifies row failures, column failures, and random location failures in the main memory block 17 and generates the data required to map those failures. In one presently preferred implementation of the invention, the data file to be loaded in the non-volatile memory 19 consists of 512 bytes.

Following the generation of the map data file, the tester commands the PCM 16 to enter Write Mode. The tester then generates an appropriate number of write cycles (one for each byte of binary data within the map data file), which transfer the map data file byte-by-byte to the PCM 16 over the local data bus LCLDB. The PCM 16 responds to each write cycle of the tester by generating a write cycle of its own, which sequentially transfers each byte to the non-volatile memory 19. Write Mode concludes when the map data file has been completely written to the non-volatile memory 19.

The PCM 16 enters an Upload Mode whenever a system "power up" condition is sensed. However, during testing, the tester generates this condition. Upon entering the Upload Mode, the PCM 16 executes a series of read cycles (512 for the aforementioned preferred implementation of the invention). The map data file within the non-volatile memory 19 is transferred byte-by-byte, into internal registers within the PCM 16. When the entire map data file has been transferred from the non-volatile memory 19 to the PCM's internal registers, the PCM 16 automatically enters Active Mode.

In Active Mode, the PCM 16 is completely configured and is ready to perform address replacements in "real time". With the PCM 16 in Active Mode, the PCM 16 is able to detect defective addresses, decouple the main memory block 17 from the data bus 15 by sending an output disable signal OE to the main memory block 17 when a defective address is detected, and simultaneously supervise access to a designated location within the replacement memory. When accessed, the data stored in the designated location within the replacement memory 18 is coupled to the bi-directional data bus 15. With the PCM 16 in Active Mode, the tester executes the memory module test again to verify that all memory errors identified in the initial test have been eliminated.

After the memory module has been tested and the non-volatile memory 19 programmed, the memory module 10 is available for installation in a data processing system. When installed in such a host system, the PCM 16 enters the Upload Mode whenever it senses a power up condition and uploads the contents of the non-volatile memory 19 into its internal registers. Memory locations within the non-volatile memory 19 and the replacement memory 18 are addressed by the PCM 16 over the local address bus LCLAB.

Two additional modes may optionally be incorporated in the PCM 16 so as to improve testability of the module itself. The first, an SRAM Test Mode, permits testing of the replacement memory 18 on the module itself. The second, a Readback Mode, permits testing of the PCM 16, itself, by allowing a byte-by-byte readback of information stored in the PCM's internal registers after the registers have been loaded from the non-volatile memory 19.

In the event of new failures occurring in the main memory block 17, the CPU 11 of the host system may also run a memory test, identify new failure locations, and command the PCM 16 to enter Maintenance Mode. A special command sequence is available which allows the CPU 11 of the host system to write to the non-volatile memory 19 and thus update the map data file to include the addresses and failure modes of newly discovered defective memory locations. Thus, the integrity of a memory system incorporating the present invention is maintainable without the need for removal of the memory components from the system.

Figure 2:
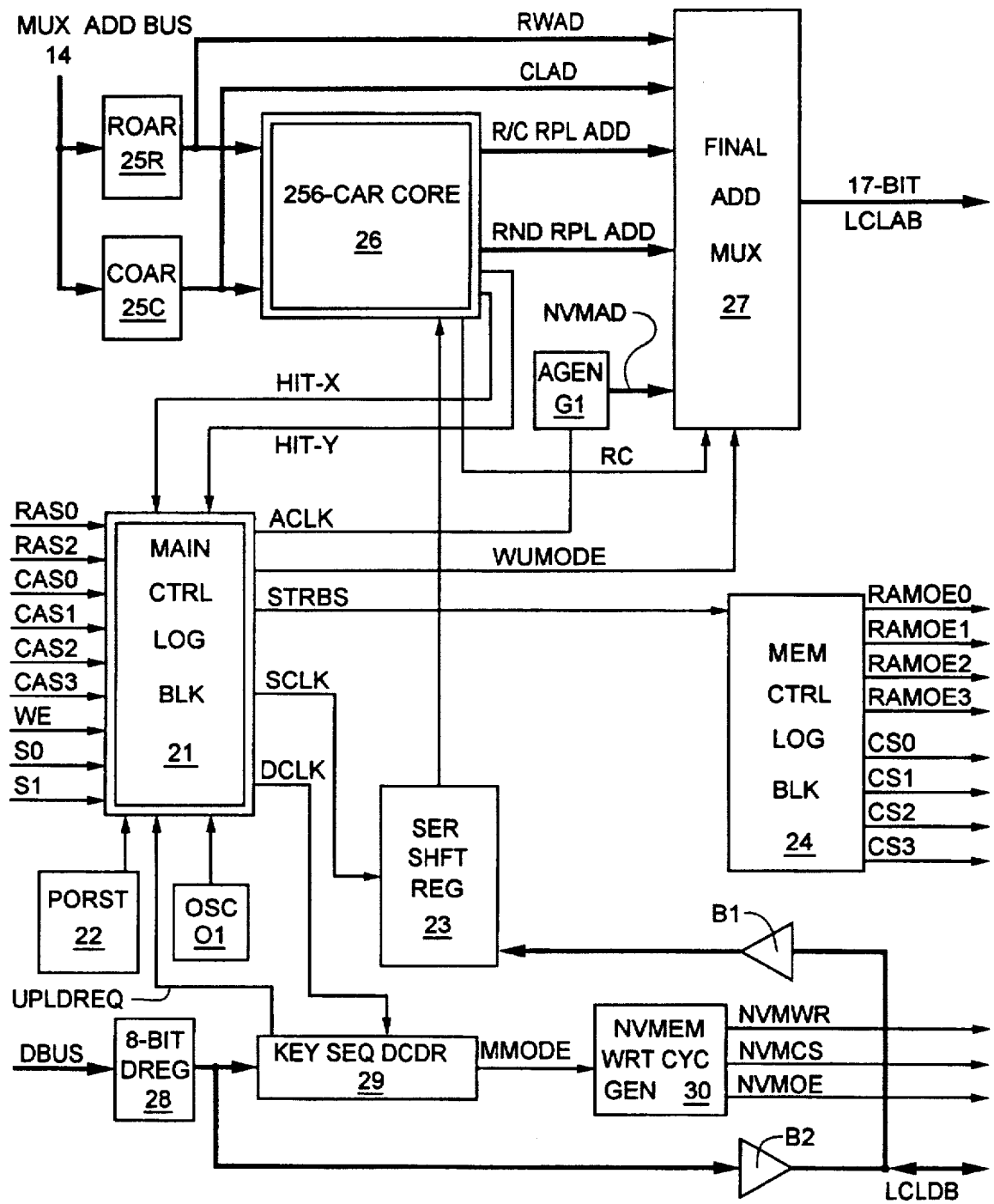
FIG. 2 is an architectural block diagram of the Process Control Module (PCM)

An architectural block diagram of the Process Control Module (PCM) 16 is depicted in FIG. 2. A main control logic block 21, which controls the entire DAIR process, is the heart of the PCM 16. The main control logic block 21 contains synchronizers, timing (clock signal) generators, state machines, and decoding logic. Operation of the main control logic block 21 is completely asynchronous to the CPU 11 of the host computer system and is driven by memory timing signals which are associated with typical memory controllers. These memory timing signals are Row Address Strobe (RAS), Column Address Strobe (CAS), and Write Cycle Enable (WE). These signals are generated in response to a CPU memory access operation, and are used directly to define the type and timing of a memory cycle when the PCM 16 is in Active Mode. The MMU 12 generates addresses which specify the location of 32-bit long words, each of which comprises four 8-bit bytes. Each of the four CAS signals (i.e., CAS0–CAS3) is used to access one of the four bytes of a word. CAS0 or CAS1 or CAS2 or CAS3 may be asserted independently to access a single byte. CAS0 and CAS1 or CAS2 and CAS3 may be asserted in pairs for a 16-bit word access. CAS0 and CAS1 and CAS2 and CAS3 may be asserted together for a 32-bit long word access. No other combination of RAS signals is valid. The two RAS signals, RAS0 and RAS2 are typical for standard DRAMs and are used for refresh cycles and addressing modes.

Still referring to FIG. 2, certain invalid combinations of the signals RAS and CAS are converted by the decoding logic within the main control logic block 21 to mode change signals. This mode change scheme will be described in more detail below, with reference to Table 1. For such mode changes, the RAS and CAS signals must be synchronized to an internal clock signal generated by an on-chip oscillator O1, which for a preferred implementation of the invention, operates at a nominal frequency of 10 megahertz. The 10-megahertz signal from oscillator O1 is used to generate an address clock signal ACLK which controls an address generator G1, a write-upload mode signal WUMODE, a shift clock signal SCLK which operates a serial shift register 23, a data clock signal DCLK which controls a key sequence decoder 29 which generates a Maintenance Mode signal M-MODE that is received by non-volatile memory cycle generator 30, and various strobe signals STRBS which control a memory control logic block 24. The memory control logic block generates DRAM output enable signals RAMOE0–RAMOE3 and DRAM chip select signals CS0–CS3. The main control logic block 21 also contains a power-on reset circuit 22 which provides a required initialization function for the PCM 16.

Under normal memory operating conditions, the RAS and CAS signals assume a limited number of allowable states to produce memory access cycles. These states are decoded by the main control logic block 21 to detect the various valid memory access cycles and identify non-access cycles such as CAS before RAS (CBR) refresh only cycles, and hidden refresh cycles. The PCM 16 must function so as to not cause erroneous interference during these types of cycles.

As heretofore stated, there is a set of CAS and RAS signal combinations which are specifically invalid (i.e., never produced by memory controllers). The main control logic block 21 of the PCM 16 takes advantage of these invalid combinations and decodes them to implement operational mode switching. The invalid combinations of RAS and CAS signals which have been arbitrarily selected to enter the various operational modes appear below in Table 1.

TABLE 1

| RAS0 | RAS2 | CAS0 | CAS1 | CAS2 | CAS3 | MODE SELECT |
|---|---|---|---|---|---|---|
| 1 | 1 | 1 | 0 | 0 | 1 | Test Mode |
| 1 | 1 | 0 | 1 | 1 | 0 | EEPROM Write Mode |
| 1 | 1 | 1 | 0 | 1 | 0 | Upload Mode |
| 1 | 1 | 1 | 1 | 1 | 0 | SRAM Test Mode |
| 1 | 1 | 0 | 1 | 1 | 1 | Readback Mode |
| 1 | 1 | 0 | 1 | 0 | 1 | Soft Reset |

The input signals S0 and S1 to the main control logic block 21 are used to define the DRAM topology in use on the module 10. The length (i.e., the number of significant digits) of row and column replacement addresses within the DRAM memory are defined by these two inputs. Table 2 lists the setting combinations and their results.

TABLE 2

| S0 | S1 | DRAM TOPOLOGY |
|---|---|---|
| 0 | 0 | 1-megabit, 10 × 10 r/c address |
| 1 | 0 | 4-megabit, 11 × 11 r/c address |
| 0 | 1 | 4-megabit, 12 × 10 r/c address |
| 1 | 1 | 16-megabit, 12 × 12 r/c address |

Referring once again to FIG. 1, when the host system's CPU 11 issues a memory address, it is received by the MMU 12 over the linear address bus 13. The linear address is converted to a multiplexed row and column address that is sequentially issued on the multiplexed address bus 14. The PCM 16 receives the row and column addresses from the multiplexed address bus 14. In a preferred implementation of the invention, the multiplexed address bus 14 has 12 address lines, which permits the use of DRAM devices as large as 16 megabits. Future implementations may incorporate additional address lines in order to accommodate larger capacity DRAMs.

Referring once again to FIG. 2, row addresses are clocked into a row address register 25R constructed from data flip-flops on the falling edge of RAS0 or RAS2. Column addresses, on the other hand, are latched into a column address register 25C on the falling edge of one or more of signals CAS0–CAS3. The column address register 25C is constructed from data latches instead of data flip-flops. For the data flip-flops, the input value is transferred to the output on the falling edge of RAS (RAS is active low) and remains at that value until the next high-to-low transition of RAS. For the data latches, when CAS is high (like RAS, CAS is also active low), the latches are transparent (i.e., the output is the same as the input); when CAS is low, the output is latched and independent of the input. Since memory controllers place a valid column address on the bus early and well before CAS transitions to its low state, the use of data latches for retaining column addresses permits faster decoding of column address than would be possible if data flip-flops were used. The data latches and data flip-flops hold the column address and the row address, respectively, for subsequent detection by the PCM's core 26, the structure of which will be detailed below.

Still referring to FIG. 2, an explanation of how the PCM 16 is able to decouple the main memory block 17 from the data bus 15 is in order. DRAM devices are typically equipped with an output enable pin which, as a general rule, is grounded upon installation so as to provide a permanent active low condition. However, the output enable pins of DRAM devices installed on a memory module fabricated in accordance with this invention are controlled by the PCM 16. Only for read cycles where a defective address is identified does the PCM 16 provide a high logic level to the output enable pin of the affected DRAM device in order to suppress its output. For write operations, the PCM 16 does not attempt to suppress a write operation to a defective memory location, but merely performs a parallel write to the replacement memory 18. The output enable signals for the DRAM devices emanate from memory control logic block 24 and are designated RAMOE0-RAMOE3 (i.e., one for each CAS signal present).

The core 26 of the PCM 16 contains a plurality of content-addressable registers (CARs) and associated encoding logic (not shown). For a preferred embodiment of the invention, the core contains 256 14-bit CARs. Each CAR is formatted with two 8-bit bytes read from the non-volatile memory 19. Replacement addresses are generated as outputs of the core 26 only if the input address from 25R and 25C matches the contents of one of the core CARs. The core generates three signals, RC, HIT-X, and HIT-Y. These signals will be explained below in relation to both FIG. 4 and Table 3.

The replacement addresses generated by the core 26 (i.e., a row or column replacement address R/C RPL ADD and random replacement address RND RPL ADD) are fed to a final address multiplexer 27 having signals RC and the write upload mode signal WUMODE as control inputs. The final address multiplexer 27 also receives the unmodified row address and the unmodified column address from registers 25R and 25C, respectively. During Write Upload Mode, Address Generator G1 generates non-volatile memory addresses which are also input to the final address multiplexer 27. Either a replacement memory address or a non-volatile memory address is output on the 17-bit local address bus LCLAB.

Still referring to FIG. 2, a quintet of 8-bit data registers 28 is coupled to an 8-bit-wide data bus DBUS, which is coupled to the lowest eight bits of the bi-directional data bus 15. As loading of the 8-bit data registers 28 is the only task required of DBUS, it is uni-directional. A key sequence decoder 29 decodes key sequences used to enter the Maintenance Mode. A non-volatile memory cycle generator 30 generates a non-volatile memory write signal NVMWR, a non-volatile memory chip select signal NVMCS and a non-volatile memory output enable signal NVMOE, which control write cycles for the non-volatile memory 19. Buffers B1 and B2 and employed to buffer the local data bus LCLDB from an input to the serial shift register 23 and an output from the 8-bit data registers 28, respectively. The local data bus LCLDB is bi-directional to permit the non-volatile memory 19 (an EEPROM in the preferred embodiment) to be written to and read from.

Figure 3:
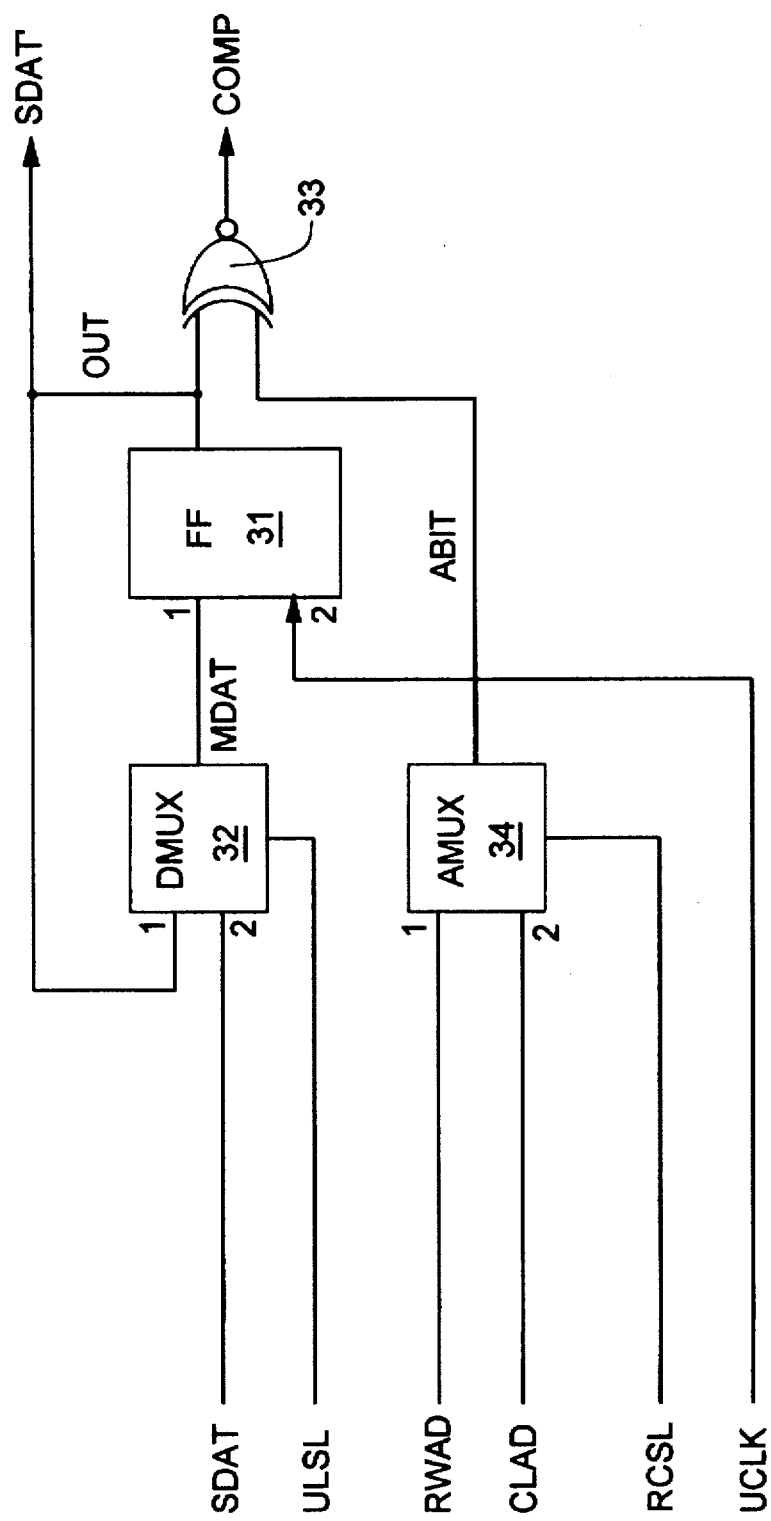
FIG. 3 is a block diagram of a Content Addressable Memory Cell (CAM)

The Content Addressable Registers (CARs) within the core 26 are constructed from multiple, serially-coupled content addressable memory cells, such a cell being the "atomic" functional unit of a CAR. FIG. 3 is a logic diagram of such a content addressable memory (CAM) cell. Each CAM cell contains a single flip-flop 31 having an output OUT, an upload clock input UCLK, a multiplexed data input MDAT from data multiplexer DMUX 32, DMUX 32 having first and second inputs controlled by upload select signal ULSL. The first and second inputs to DMUX 32 are the feedback of output OUT from flip-flop 31 and a serial data stream SDAT from the immediately previous CAR stage (either another CAM cell or a CAR input), respectively. When upload select signal ULSL is low, the feedback output OUT at the first input is selected so that the value stored in the cell is latched; when signal ULSL transitions from low to high, the serial data SDAT from the previous cell at the second input becomes the MDAT input to flip-flop 31. The new output OUT of flip-flop 31 SDAT' is fed back to DMUX 32 and to the next CAR stage. The cell architecture permits a group of cells comprising a CAR to function as a shift register during Upload Mode. Output from the flip flop 31 is also fed to the first input of an exclusive NOR gate 33, NOR gate 33 having a second input which receives a row or column address bit ABIT from address multiplexer AMUX 34 having a row address input RWAD and a column address input CLAD. When ABIT is a row or column bit depends on the state of row/column select signal RCSL. The output COMP of NOR gate 32 is positive true when the stored cell value (i.e., output O of flip-flop 31) matches the row or column bit value ABIT.

Figure 4:
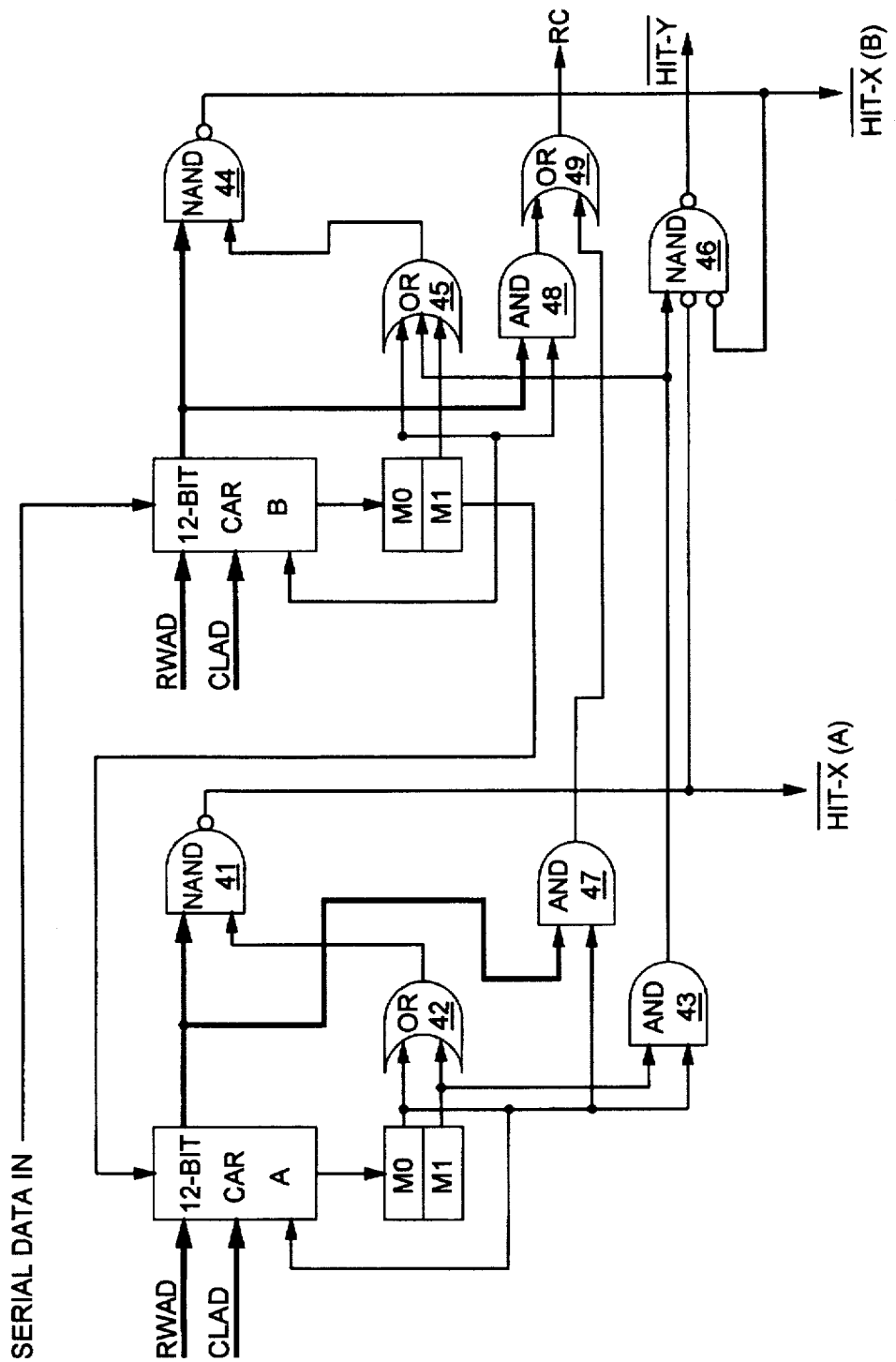
FIG. 4 is a block diagram of a cross-linked pair of Content Addressable Registers (CARs)

FIG. 4 is a block diagram of a pair of adjacent Content Addressable Registers (CARs), CAR A and CAR B. In the preferred implementation of the invention, each CAR contains 12 CAM cells of the type depicted in FIG. 3. In addition, two additional flip flops are added to the CAR as control bits M0 and M1. The total of 14 bits is referred to as a CAR. The control bits do not participate in an address comparison, but act to define the type of comparison made. The control bits also specify whether a CAR is inactive, an inactive CAR being one which does not participate in address comparisons. Inactive CARs are those that remain when there exist insufficient numbers of defective main memory locations to fill every CAR with mapping data. This, of course, is the preferred situation, as the non-volatile memory 19 can be loaded with additional mapping information to repair main memory locations which occur subsequent to memory module assembly.

Still referring to FIG. 4, the comparison result from CAR A is formed by NANDing, at NAND gate 41, an output from each of the 12 cells which pertain to CAR A and an enable signal output from OR gate 42, which decodes the two control bits M0 and M1. OR gate 45, NAND gate 44, and AND gate 48 (all associated with CAR B, correspond respectively to OR gate 42, NAND gate 41 and AND gate 47 of CAR A. The output is called the HIT-X output. The designation of the signals as HIT-X (A) and HIT-X (B) merely indicates that the CAR A is involved in the first comparison, while Register B is involved in the second comparison. A pair of CARs may be optionally cross-linked together to form a 24-bit random address by specifying a particular combination of control bits M0 and M1 for the first of two adjacent CARs (i.e., CAR A). The output of the cross-linked pair, emanating from NAND gate 46, is called the HIT-Y output. For the cross-linked configuration, the CAR A compares its 12 address bits to the incoming row address and CAR B compares its 12 address bits to the incoming column address. The output and the M0 bit of register A are input to AND gate 47, while the output and the M0 bit of register B are input to AND gate 48. The outputs of AND gate 47 and AND gate 48 are input to OR gate 49, the output of which provides signal RC. Table 4 defines the CAR function and the value of signal RC in terms of the M0 and M1 control bits.

TABLE 3

| M0 | M1 | DECODED MEANING |
|----|----|----|
| 0 | 0 | register inactive, no comparison made |
| 1 | 0 | row replacement addr in CAR, RC = 1 |
| 0 | 1 | column replacement addr in CAR, RC = 0 |
| 1 | 1 | random replacement addr in CAR, RC = 1 |

When the control bits M0 and M1 of a particular CAR are decoded and both found to equal "1" value, a cross-linked mode is recognized. For this cross-linked mode, a 24-bit address is defined, with the row address being in the CAR in which this mode is identified, and the column address being in the next CAR. When a row or column address match is determined, X=1. The value of RC specifies whether row or column. When a random address match is determined, Y=1. The value of RC is meaningless for this condition. The logical OR of X and Y generates the signal HIT. When HIT=1, replacement action is initiated; when HIT=0, no replacement action is taken by the PCM 16 and the DRAM memory is accessed normally.

Figure 5:
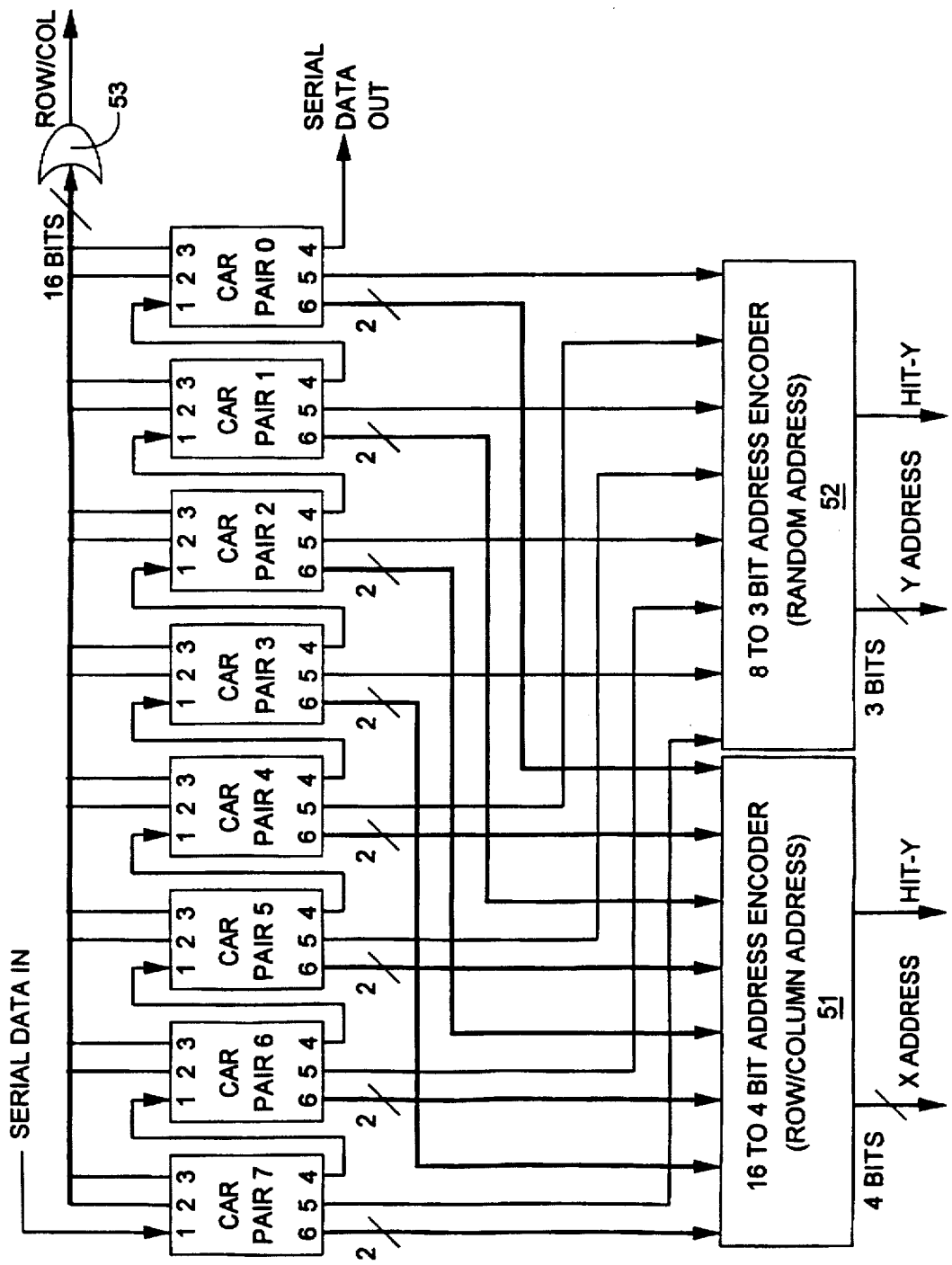
FIG. 5 is a block diagram which depicts the structure of the subcore and the interconnection of the subcore with the address encoders.

The subcore is the next level of integration of the core, and it combines 16 CARs (8 pairs) together with address encoding logic. FIG. 5 is a block diagram of this structure. Serial data is input at terminal 1 and output at terminal 4 of CAR pair 7, the output of CAR pair 7 being input to terminal 1 and output at terminal 4 of CAR pair 6, and so on. The row/column replacement addresses are generated from the sixteen X outputs (two bits from each output 6 of each CAR pair), and yield a 4-bit row or column address. The sixteen X outputs are also fed to a 16-input OR gate (not shown) within the row/column address encoder block 51 to produce a subcore HIT-X signal output. The random addresses are generated from the eight Y outputs (one bit from each terminal 5 of each CAR), and yield a 3-bit address. The eight Y outputs are also fed to an eight input OR gate (not shown) within random address encoder block 52 to produce a subcore HIT-Y signal output. In this manner, the first level of replacement address encoding is performed. Likewise, the 16 single-bit RC signals from the CARs are fed to OR gate 53, which generates a composite subcore ROW/COL signal output. In FIG. 5, it will be noted that the serial upload data stream is preserved and links all the register pairs together from pair number 7 to pair number 0.

Figure 6:
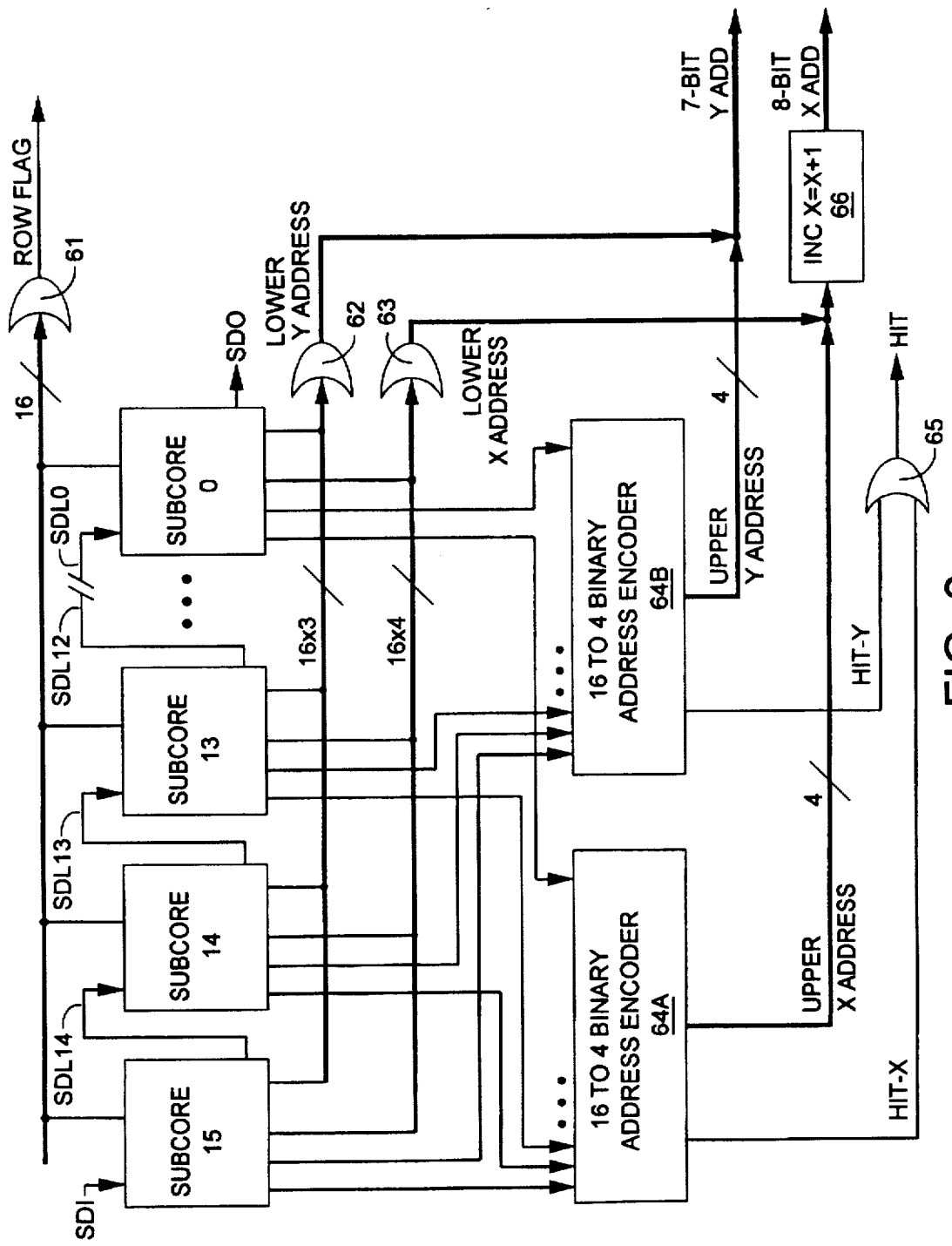
FIG. 6 is a block diagram of the core.

The core is the final level of integration of the CARs and combines 16 subcores together with address encoding logic. FIG. 6 is a block diagram of this structure. The result is a core containing a total of 256 CARs or 128 CAR pairs. The address encoding scheme is similar to that of the subcore design. The result is an 8-bit X address for row/column replacements, and a 7-bit Y address for random address replacements. The X address is passed through an incrementer 66 in order to add 1 to the address. This is needed to properly map the final replacement address into locations within the replacement memory 18. Serial data is fed to the core through input SDI. As before, the serial data lines SDL14-SDL0 link the 16 subcores together for data uploading. Serial data is output from the core through output SDO. A 17-bit replacement address within the replacement memory 18 is output from the final address multiplexer 27 (refer to FIG. 2). A replacement address is assembled from the following four address inputs to the final address multiplexer 27: a 12-bit unmodified row address; a 12-bit unmodified column address; the 8-bit row/column replacement address; and the 7-bit random replacement address. The replacement address is output to the replacement memory 18. The 17-bit local address bus LCLAB supports up to 128K long-words of replacement memory. Depending on the values of the topology control input signals S0 and S1, the RC signal, and the HIT-X (HTX) and HIT-Y (HTY) signals; an appropriately mapped replacement address is produced. Table 5 summarizes the address mapping as a function of the input control signals.

TABLE 4

| S0 | S1 | HTX | HTY | RC | SRAM REPLACEMENT ADDRESS RANGE |
|----|----|-----|-----|----|----|
| X | X | X | 1 | X | 7-bit address=000-3FF, max=128 addresses |
| 0 | 0 | 1 | 0 | 1 | 18-bit address=400-1FFFF, max=128 rows |
| 0 | 0 | 1 | 0 | 0 | 18-bit address=400-1FFFF, max=128 cols. |
| 1 | 0 | 1 | 0 | 1 | 19-bit address=800-1FFFF, max=64 rows |
| 1 | 0 | 1 | 0 | 0 | 19-bit address=800-1FFFF, max=64 columns |
| 0 | 1 | 1 | 0 | 1 | 19-bit address=800-1FFFF, max=64 rows |

TABLE 4-continued

| S0 | S1 | HTX | HTY | RC | SRAM REPLACEMENT ADDRESS RANGE |
|---|---|---|---|---|---|
| 0 | 1 | 1 | 0 | 0 | 19-bit address=800-1FFFF, max=64 columns |
| 1 | 1 | 1 | 0 | 1 | 20-bit address=1000-1FFFF, max=32 rows |
| 1 | 1 | 1 | 0 | 0 | 20-bit address=1000-1FFFF, max=32 columns |

The "max=" comment in the table refers to the 17-bit RA limitation. Expansion of the address width beyond 128K will permit more row/column replacements than the maximum indicated. The fifth multiplexer input is the 10-bit Address Counter used to read or write to the non-volatile Memory 17 when either Write Mode or Upload Mode is active.

Figure 7:
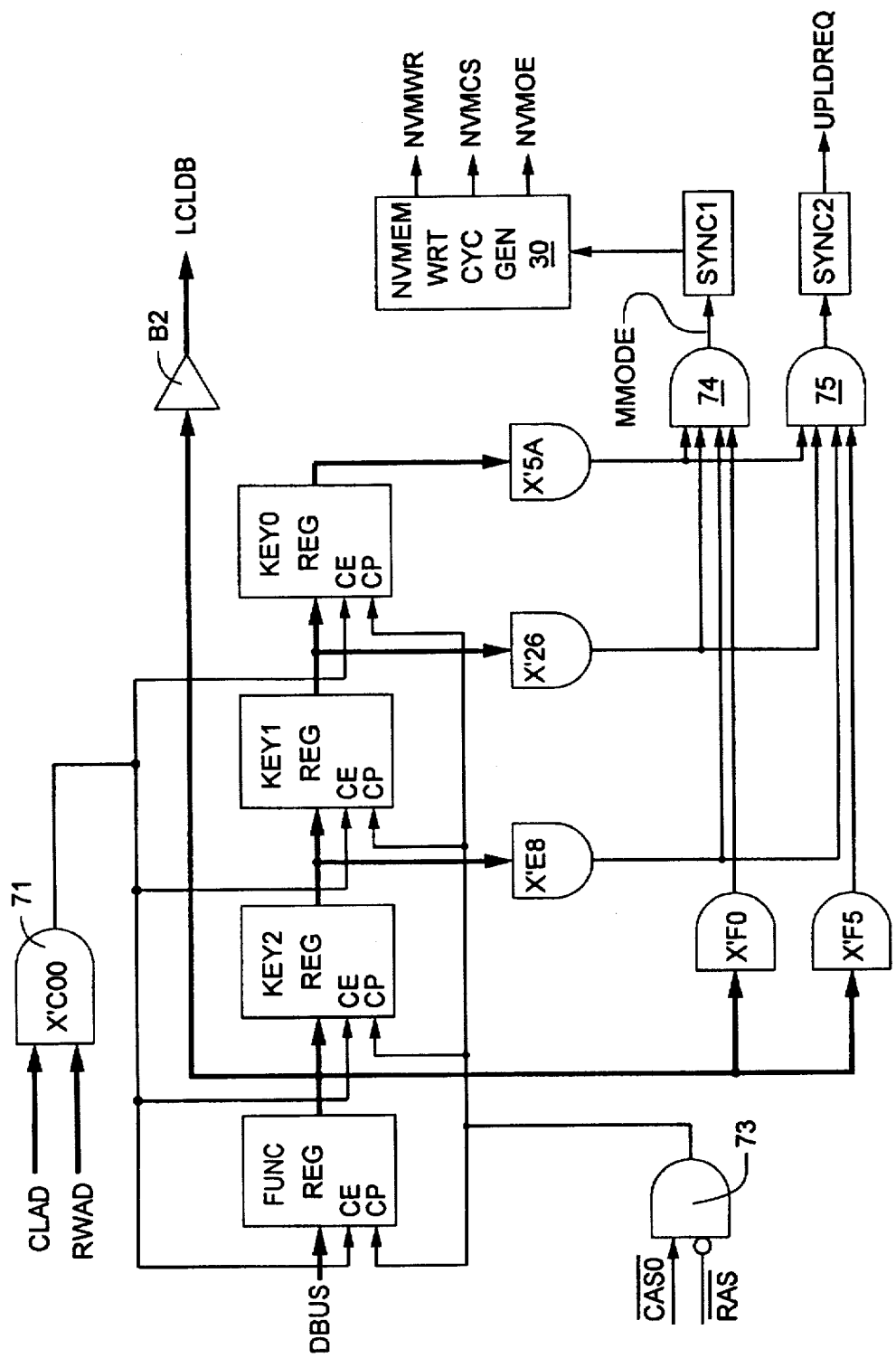
FIG. 7 is a block diagram of key sequence detection logic.

FIG. 7 is a block diagram of the logic used to detect and implement the Maintenance Mode. Maintenance Mode is a tool which permits the replacement image stored in the non-volatile memory 19 to be updated by the host CPU in response to newly discovered failures in the system memory 12. The Maintenance Mode permits correction of such failures without physical intervention or removal of memory modules comprising the system memory 12 from the system.

Since no special programming interfaces or I/O ports are permitted on memory modules, all command and control functions must be transmitted through the existing hardware connections. The system architecture of the Intel 80×86 family of microprocessors requires a basic input/output system (BIOS) which is stored in a block of read only memory (ROM) having a starting address at x'C000 (the x' designation indicates that hexadecimal notation is used). Because the BIOS operates in a read-only mode, write operations to BIOS memory locations are meaningless to the host system and, thus, are ignored. The Maintenance Mode software takes advantage of this fact by communicating with the PCM 16 via write operations to memory location x'C000.

During normal operation of the host system CPU 11, frequent read accesses are made to the BIOS memory. In order to eliminate the possibility that the PCM 16 might respond to an improperly written BIOS access performed by the host system, additional encoding is incorporated into PCM commands by using the data path in combination with the address path. A special key sequence of three data bytes is defined and followed by a fourth command code byte which may be followed by a fifth data value byte. The Maintenance Mode software attempts to write the four or five byte sequences to BIOS location x'C000. Two such sequences are defined for the Maintenance Mode and are recognized by the PCM 16. The first sequence, listed in Table 5, invokes the Write Command.

TABLE 5

| BYTE | VALUE | FUNCTION |
|---|---|---|
| 0 | 5A | key 0 |
| 1 | 26 | key 1 |
| 2 | E8 | key 2 |
| 3 | F0 | write command |
| 4 | data byte | operand |

The second sequence, listed in Table 6, invokes the Upload Command so that while the host system is operating in the Maintenance Mode, the updated map can be loaded into the PCM 16 and a standard memory test run to verify that all defective memory locations within the main memory block 17 have been corrected.

TABLE 6

| BYTE | VALUE | FUNCTION |
|---|---|---|
| 0 | 5A | key 0 |
| 1 | 26 | key 1 |
| 2 | E8 | key 2 |
| 3 | F5 | upload command |

After the normal upload sequence has occurred and the PCM 16 has entered the Active Mode, normal memory accesses may proceed. At this time, the Maintenance Mode software may be run to perform any needed updates to the replacement image within the non-volatile memory 19. The software writes the Write Command Sequence as many times as needed to load new bytes into the non-volatile memory 19. The PCM 16 accepts the bytes written to address x'C000 and checks each one sequentially for the proper key values. The hardware decodes byte number three for the operation code and if it is equal to x'F0, the hardware initiates a write cycle to the non-volatile memory 19. The byte written follows the operation code byte number 3.

The 8-bit data registers 28 and the key sequence decoder 29 (both of FIG. 2) are depicted in greater detail in FIG. 7. The eight-bit data registers comprise a key 0 register, a key 1 register, a key 2 register, a function register, and an operand register (not shown). Each of the first three registers stores one of the four bytes required to initiate either a write operation to or an upload operation from the non-volatile memory 19; the functional register stores the byte which is decoded to determine whether the operation will be an upload operation or a write operation; and the operand register stores a data byte which will be written to the non-volatile memory 19 via the local data bus LCLDB during a write operation. Each of the four 8-bit registers is enabled by a clock enable signal CE, which is generated by AND gate 71 in response to a write operation to the BIOS memory address x'C000. Loading of the five registers is clocked by a clock pulse signal CP, and the eight-bit data bus DBUS corresponds to the bus of like designation in FIG. 2. The various AND gates x'F5, x'F0, x'E8, x'26 and x'5A are each labeled with the byte for which it decodes (see Tables 5 and 6 above). AND gate 74 generates the signal MMODE which initiates a write cycle to the non-volatile memory 19. Special state machine circuitry, which includes synchronizer SYNC1 and non-volatile memory write cycle generator 30, is needed to execute the write cycle to the non-volatile memory 19. The timing requirements are 200 microseconds per cycle and are unrelated to the CPU write cycle, which is substantially shorter and asynchronous. The Maintenance Mode software must take this into account and wait the required cycle time before attempting another write cycle. The output of AND gate 75, which decodes for the upload mode, is fed to a second synchronizer SYNC2, which generates the upload request signal UPLDREQ, which is fed to main control logic block 21.

When all update write cycles have been completed, the Upload Mode command sequence is written to the PCM 16. The PCM 16 responds by initiating a new upload sequence which loads the contents of the updated non-volatile memory 19 into the registers of the PCM 16. When the upload is complete, the PCM 16 returns to Active Mode.

Read and write operations to the non-volatile memory 19 require an address. The PCM 16 automatically generates the needed address for each type of non-volatile memory access cycle.

Figure 8:
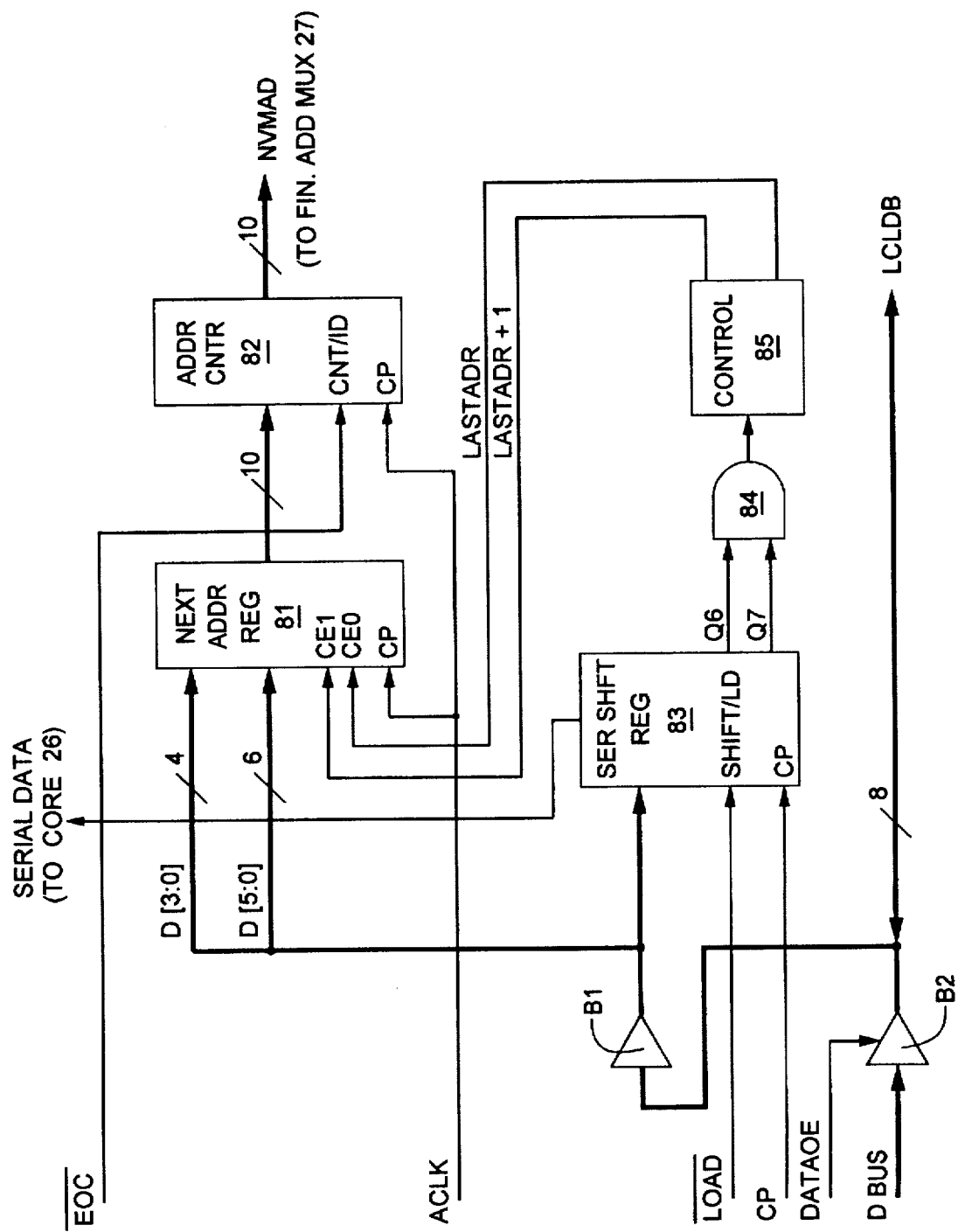
FIG. 8 is a block diagram of address generator logic for the non-volatile memory.

FIG. 8 is a block diagram of the non-volatile memory address generator G1. The 10-bit non-volatile memory address NVMAD is produced by a binary address counter 82 which is set at zero when either Write Mode or Upload Mode is commanded. The non-volatile memory address, which increments on each write or read cycle, is in step with the clock pulse input CP from the address clock signal line ACLK. The end of cycle signal EOC bar goes low when an upload is complete, which triggers the loading of the next available free address to be loaded from the next address register 81. The next address register 81 receives two data bytes which are formatted for 10 bits total. This 10-bit data word is calculated by the test software and specifies the next available free address within the non-volatile memory 19. At the end of a non-volatile memory write sequence, the final two data bits Q6 and Q7 are decoded by AND gate 84 to activate control circuit 85, which generates clock enable signals CE0 and CE1, which initiate the loading of the next address register 81 with the 10-bit data word corresponding to the next free address. During a write sequence in Write Mode, ACLK is pulsed on the rising edge of CAS0, which is produced by the tester. The serial shift register, which is controlled by the load signal LOAD bar and the clock pulse CP, produces a serial data stream through which the contents of the non-volatile memory 19 are loaded to the CARs within the core 26. The data output enable signal controls buffer B2, which buffers the lowest eight bits (DBUS) of the bi-directional data bus 15 from the local data bus LCLDB.

Figure 9A:
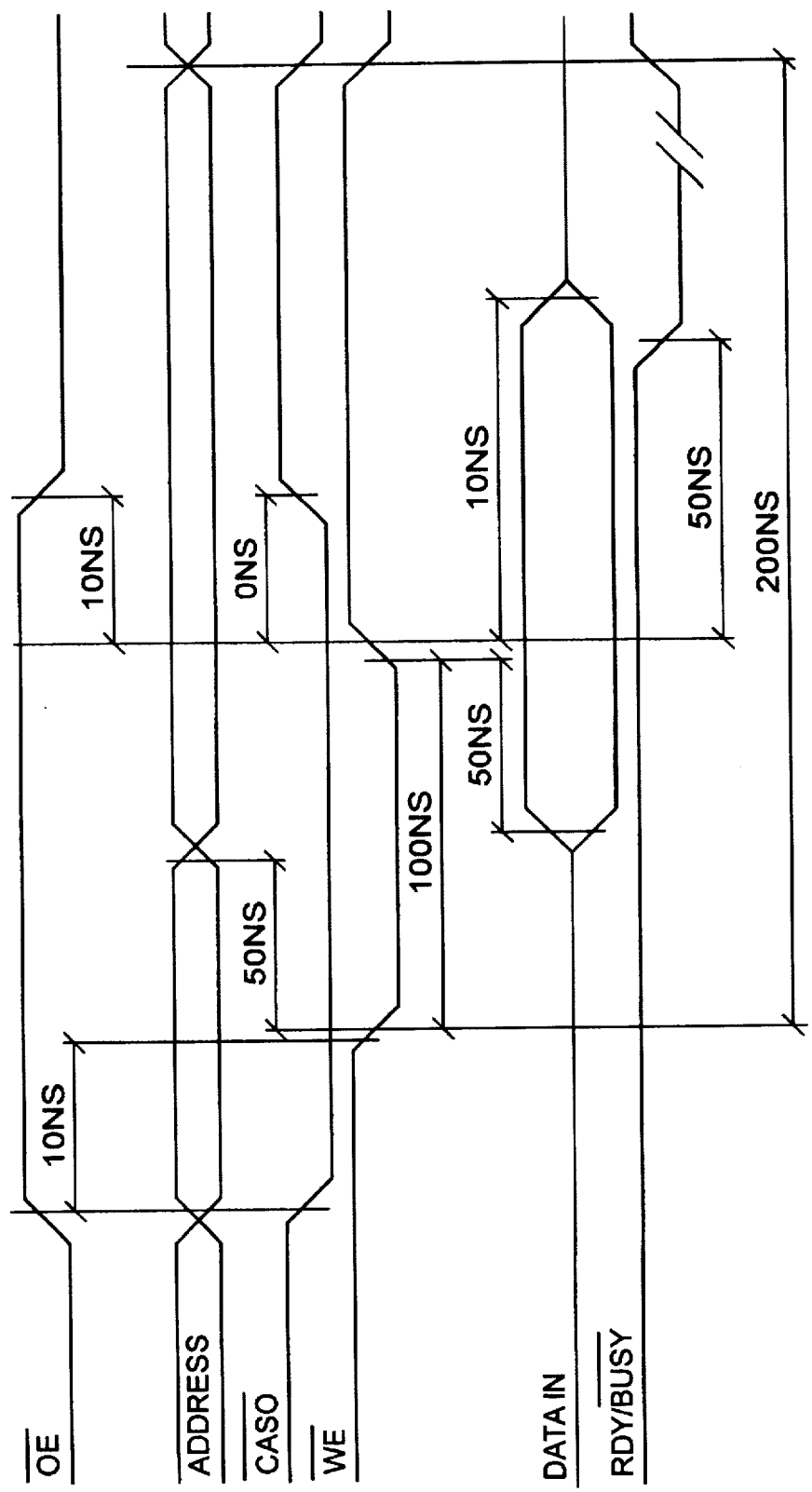
FIG. 9A is a Write Mode timing diagram which depicts associated signal levels during a write operation controlled by the signal Write Enable Bar.
Figure 9B:
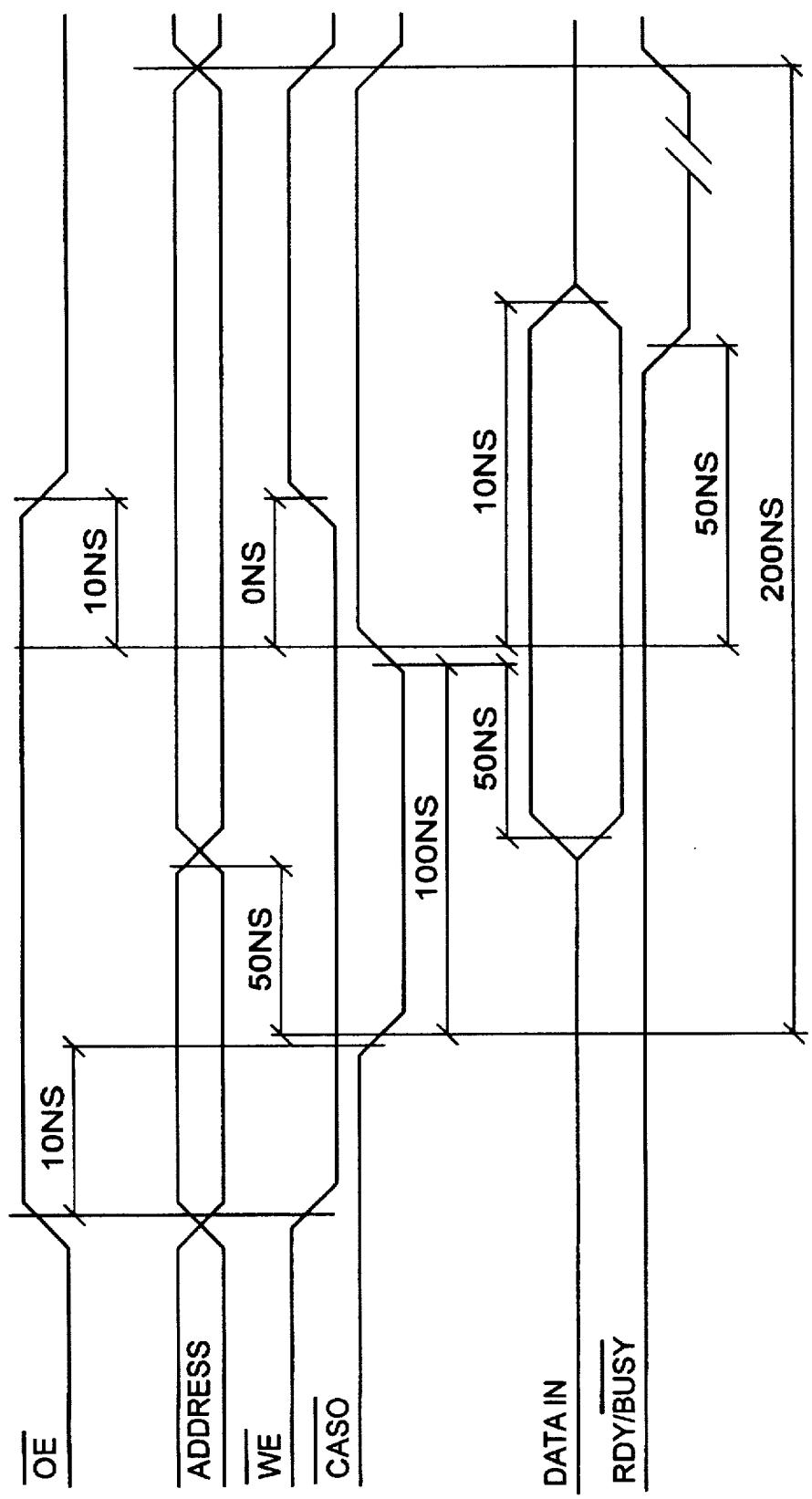
FIG. 9B is a Write Mode timing diagram which depicts associated signal levels during a write operation controlled by the signal Chip Enable Bar.

In Write Mode, the tester is responsible for meeting the write timing requirements of the non-volatile memory 19. FIGS. 9A and 9B illustrate these timing requirements.

In Upload Mode, the read cycles are timed by the PCM control logic. A new byte is read by the PCM control logic every 800 nanoseconds (nominal). The data enters on the 8-bit bi-directional Program Data Bus, and is loaded into the shift register. The CP clock at 10 MHz (nominal) serializes the data, and transmits it to the core. Each byte read is monitored for the unique value of x'C0 through x'FF. These values have both most significant bits equal to one, and is the flag byte that identifies the first byte of the "next available" address of the replacement image within the non-volatile memory 19. The flag byte triggers the PCM 16 to load the byte and the next byte following into the Next Address Register. When the upload sequence terminates, the PCM 16 returns to the Active Mode, and the address counter loads the value of the next address from the register. The hardware is now ready to accept Maintenance Mode update commands, should they be needed. The address register now points to the proper address in the non-volatile memory 19 where the first update byte will be stored.

Figure 10:
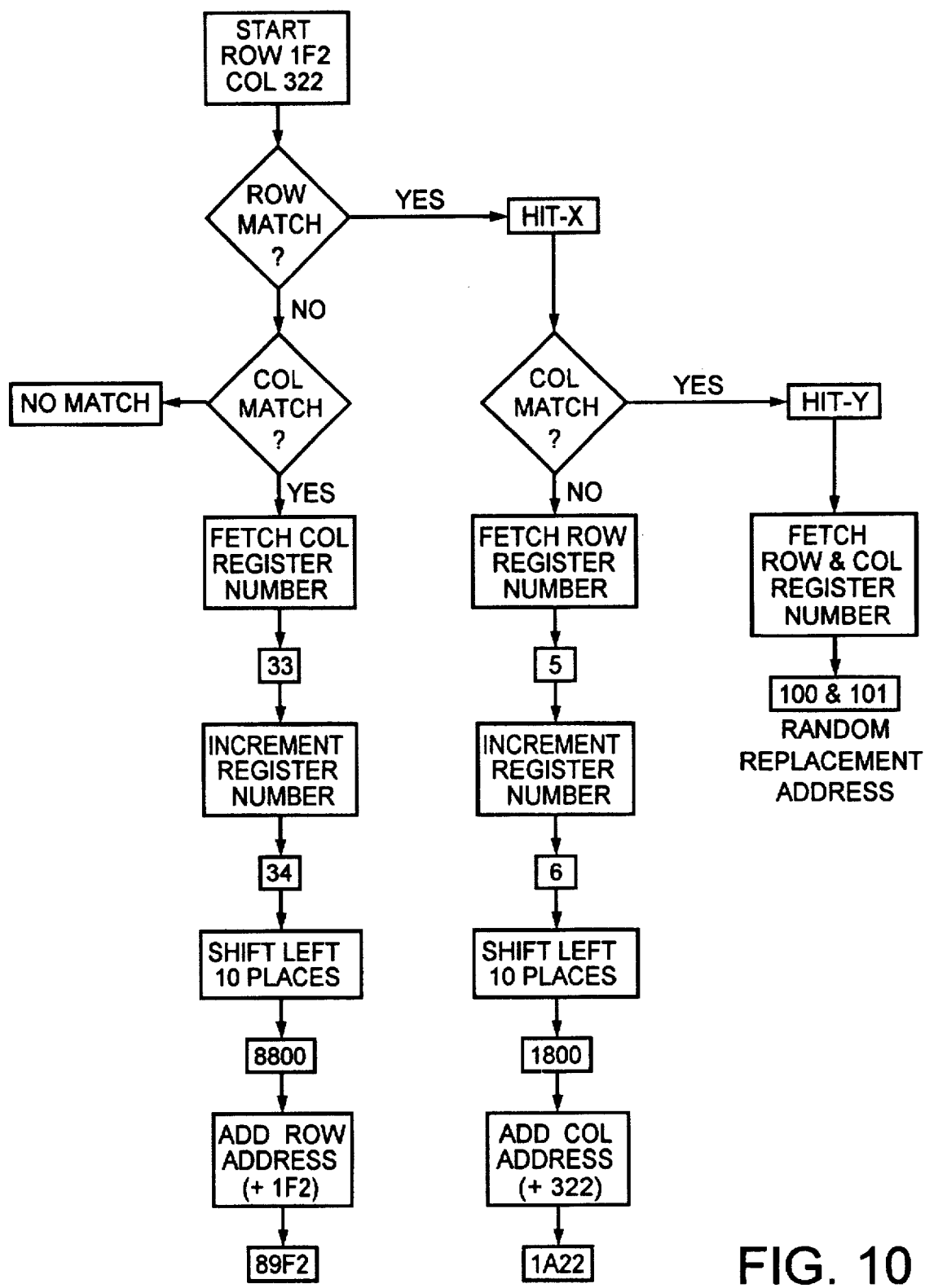
FIG. 10 is a replacement address generation flow chart for the hypothetical row/column address 1F2/322.

FIG. 10 is a replacement address generation flow chart for the hypothetical incoming hexadecimal row/column address 1F2/322. In this hypothetical case, the main memory block 17 is comprised of 1-megabit DRAM chips having 1024 rows by 1024 columns. All numbers on the chart are expressed in hexadecimal notation. The block starts with the latching of row address 1F2 and column address 322 in the PCM's row address register 25R and column address register 25C, respectively. The contents of the row address register 25C is compared first against the contents of each active CAR register. A row address match results in the generation of a HIT-X signal; if no match is found, the column address is then compared against the contents of each active CAR register. If no column address match is found, the PCM 16 does not intervene and the main memory is written to or read from in normal fashion. If, however, a column match is found to exist, the register in which the defective column address is stored is fetched. In this hypothetical case, let us assume that the register number is 33 HEX. The register number is then incremented by 1 to 34 HEX, which assures that an entire block is left at the bottom of the replacement memory for random address replacements. In order to calculate a starting address for the column in the replacement memory 18, a ten-place shift to the left is performed on the incremented register value. A ten-place shift is equivalent to multiplication by 1024, the number of bits in each column of the 1-megabit DRAM device. This results in a value of 8800 HEX. In order to calculate the address within the column corresponding to the incoming row value, the row address is added to the starting column address. Thus, 8800 HEX+1F2 HEX=89F2 HEX. A linear address scheme is utilized for the SRAM replacement memory and the address 89F2 corresponds to the linear replacement address within the SRAM for the defective address 1F2/322 in the DRAM chip.

Still referring to FIG. 10, if a defective row address is detected and a HIT-X signal is generated, the contents of the column address register 25C is compared with the contents of each active CAR register. If a match is found to exist, a HIT-Y signal is generated; if no match is found to exist, the row register number is fetched. In this hypothetical case, let us assume that the register number is 5 HEX. The register number is then incremented by 1 to 6 HEX. In order to calculate a starting address for the row in the replacement memory 18, a ten-place shift to the left is performed on the incremented register value. A ten-place shift is equivalent to multiplication by 1024, the number of bits in each row of the 1-megabit DRAM device. This results in a value of 1800 HEX. In order to calculate the address within the row corresponding to the incoming column value, the column address is added to the starting row address. Thus, 1800 HEX+322 HEX=1A22 HEX. Thus, the linear address 1A22 HEX corresponds to the replacement address within the SRAM for the defective address 1F2/322 in the DRAM chip.

Still referring to FIG. 10, if a defective column address is detected and a HIT-Y signal is generated, this condition is indicative of a random failure within the DRAM chip. A HIT-X & HIT-Y condition means that the defective row and column addresses are stored in an adjacent pair of CARs. The number of the first register of the adjacent register pair is fetched. In this hypothetical case, the pair comprises registers 100 HEX and 101 HEX. The address of a 32-bit replacement location within the replacement memory 18 is 100 HEX.

As all CARs are organized in pairs and the two CARs within a pair may be cross-linked to define a defective random address in the main memory block 17, it should be clear that random addresses must begin on an even numbered register within the core 26. In order to most efficiently store addresses within the CARs, all addresses corresponding to row or column failures are loaded together, as are all addresses corresponding to random failure locations. Thus, no more than one CAR is wasted when it comes time to load random failure addresses. This loading format is deviated from only during maintenance mode. At such time, it may be necessary to load both defective row/column addresses and defective random addresses. Since the CARs within the core 26 have already been partially loaded, the newly discovered failure addresses are loaded starting with the first inactive CAR. Once again, row/column addresses and random addresses are loaded separately in order to most efficiently utilize the remaining inactive space.

Although only a single embodiment of the invention has been disclosed herein, it will be obvious to those of ordinary skill in the art that changes and modifications may be made thereto without departing from the scope and the spirit of the invention as hereinafter claimed. For example, it should be clear that the invention may be utilized to provide repair capability during use to a semiconductor memory block that is either fully functional (i.e., no bad bits) when the module is assembled or one that contains one or more defective bits when assembled. Additionally, it should also be clear that certain computer architectures may dispense with an MMU and that the new memory system may be adapted to such systems. Though far less convenient than the proposed preferred embodiment, if the memory is tested every time at system boot-up, the map data can be generated anew at each such event, thus eliminating the need for non-volatile memory. Incorporation of the non-volatile memory, however, eliminates the delay that would occur during testing and mapping at boot-up, and also permits shipment of memory modules which are fully functional upon installation in a host computer system.

I claim:

1. In combination with a host computer system having a central processing unit (CPU) coupled to both a system data bus and a linear address bus, a system memory address bus, and a memory management unit (MMU) which generates multiplexed main memory addresses which are transmitted on the system memory address bus in response to linear memory addresses received from the CPU over the linear address bus, a memory module comprising:

(a) a main memory coupled to both the system data bus and the system memory address bus, said main memory constructed from at least one row and column addressable semiconductor memory device;

(b) a replacement memory coupled to the system data bus, said replacement memory having address inputs, said replacement memory constructed from at least one semiconductor memory chip; and (c) a process control module (PCM) coupled to the system data bus, to the system memory address bus, and to the replacement memory address inputs, said PCM having a plurality of content addressable registers (CARs) into which defective main memory addresses and failure mode data related to each such defective address are loaded, said PCM receiving a multiplexed address from the MMU, said PCM comparing the received address with defective main memory addresses stored within the CARs, said PCM either permitting normal system access to said main memory if the received address does not match one of the loaded defective addresses or, if said received address does match one of the loaded defective addresses, said PCM deselecting the main memory and generating a replacement memory address which is transmitted to the replacement memory address inputs, said replacement memory responding by loading data stored at the received replacement memory address on the system data bus.

2. The memory module of claim 1, which further comprises:

(a) a non-volatile memory for storing the defective main memory addresses and the failure mode data when the host computer system is powered down; and (b) a local data bus coupled to both the PCM and to the non-volatile memory, said PCM adapted to write to and read from said non-volatile memory over said local data bus.

3. The memory module of claim 1, wherein each row and column addressable semiconductor memory device is a dynamic random access memory device.

4. The memory module of claim 3, wherein each semiconductor memory chip is a static random access memory device having an access time that is less than that of each dynamic random access memory device.

5. The memory module of claim 1, wherein said PCM further comprises data registers into which is loaded a row address portion of each multiplexed main memory address, and data latches into which is loaded a column address portion of each multiplexed main memory address.

6. The memory module of claim 5 wherein the row address portion stored in the data registers and the column address portion stored in the data latches are compared against the defective main memory addresses stored in the CARs in parallel fashion in order to minimize the time required for the PCM to detect the receipt of a defective main memory address and generate a replacement memory address.

7. The memory module of claim 6, wherein the PCM compares a main memory address with main memory addresses that have been loaded in the CARs, and, if required, generates a replacement address for transmission to the replacement memory address inputs within no more than 10 nanoseconds of the main memory address having been loaded in the PCM's data registers and data latches.

8. The memory module of claim 1, wherein certain timing signals, namely Row Address Strobe (RAS), Column Address Strobe (CAS) and Write Enable (WE), when generated by the MMU in certain valid combinations, control both memory cycle type and memory cycle timing, and when generated by a tester in certain invalid combinations, are decoded by the PCM as commands to switch PCM operational modes.

9. The memory module of claim 8, wherein said host computer system has a Basic Input Output System (BIOS) read-only memory that is coupled to both the system main memory address bus and the system data bus, and switching of PCM operational modes may be also be accomplished by receipt by the PCM of a fixed sequence of key data bytes and a command code data byte from the system data bus which the host computer system attempts to write to at least one BIOS read-only memory location.

10. The memory module of claim 2, wherein said host computer system has a Basic Input Output System (BIOS) read-only memory that is coupled to both the system main memory address bus and the system data bus, the PCM being switchable to a write operational mode by an attempted writing of a string comprising a fixed sequence of key data bytes and at least one command data byte to at least one storage location within the BIOS read-only memory, said write operational mode enabling the host computer system to write updating data bytes to the non-volatile memory through the PCM in order to add address and failure mode data for storage locations within the main memory which become defective after the memory system is placed in service within the host computer system.

11. The memory module of claim 10, wherein each updating data byte written to update the non-volatile memory is appended to the string.

12. The memory module of claim 10, wherein the addresses and failure mode data stored within the non-volatile memory may be updated by the host computer system without removal of any components of the memory system from the host computer system.

13. The memory module of claim 1, wherein said main memory has at least one defective storage location.

14. The memory module of claim 1, wherein individual CARs within the PCM are organized as adjacent pairs, and any CAR may be loaded with data which identifies a single address and which also identifies whether that single address is the beginning address of a defective row or the beginning address of a defective column within the main memory.

15. The memory module of claim 14, wherein each row and column address corresponding to a random defective storage location within the main memory is loaded in both CARs of a single pair, the row portion of the address being loaded in one of the CARs of the pair, the column portion of the address being loaded in the other CAR of the pair, and data stored in the CAR containing either the row or the column address portion indicating that both CARs of the pair are cross-linked and that a random defective address is found in both CARs of the pair.

16. The memory module of claim 1, wherein neither partitioning nor specialized allocation of the CAR pairs is required for the loading of data related to the address and failure mode of defective rows or defective columns or defective random locations within the main memory.

17. The memory module of claim 1 wherein a single register is required to specify either a column or a row address, while a sequential register pair is required to specify a random location.

18. The memory module of claim 1, wherein the failure mode data is contained in control bits which specify whether the balance of the register contents point to a row address or a column address or whether the contents of the present register should be combined with the contents of the next addressable register to specify a random address, said random address being specified by both a row address and a column address.

19. The memory module of claim 18, wherein the control bits also specify whether a register is active or inactive, an active register participating in address comparisons, an inactive register not participating in address comparisons.

20. The memory module of claim 1, wherein said replacement memory has no defective storage locations.

21. The memory module of claim 1, wherein the PCM is implemented as an application specific integrated circuit.

22. A memory system for use in conjunction with a host computer system having a central processing unit (CPU) operatively coupled to both a system data bus and to a system memory address bus, said memory system comprising:
(a) a main memory operatively coupled to both the system memory address bus and the system data bus, said main memory constructed from at least one row-and-column-addressable random access memory device;
(b) a replacement memory operatively coupled to the system data bus, said replacement memory having address inputs, said replacement memory constructed from at least one semiconductor random access memory device; and
(c) a process control module (PCM) operatively coupled to the system memory address bus, to the system data bus, and to the replacement memory address inputs, said PCM having a plurality of content addressable registers (CARs) into which defective addresses within the main memory and failure mode data related to each defective address are loaded, said PCM receiving from the system address bus a main memory address which it compares to defective main memory addresses stored within the CARs, said PCM either permitting normal system access to said main memory if the received address does not match one of the loaded defective addresses or, if said received address does match one of the loaded defective addresses, said PCM deselecting the main memory and generating a replacement memory address which is transmitted to the address inputs of the replacement memory, said replacement memory responding by transmitting data stored at the replacement memory address to the system data bus.

23. The memory system of claim 22, which further comprises a non-volatile memory for permanently storing the defective main memory addresses and the failure mode data.

24. The memory system of claim 22, said replacement memory has a shorter access time than said main memory.

25. The memory system of claim 22, wherein main memory addresses are multiplexed, and said PCM further comprises data registers into which are loaded a row address portion of each multiplexed main memory address, and data latches into which are loaded a column address portion of each multiplexed main memory address.

26. The memory system of claim 25, wherein the row address portion stored in the data registers and the column address portion stored in the data latches are compared against the defective main memory addresses stored in the CARs in parallel fashion in order to minimize the time required for the PCM to detect the receipt of a defective main memory address and generate a replacement memory address.

27. The memory system of claim 22, wherein the PCM compares a received main memory address with the loaded defective main memory addresses, and, if required, generates a replacement address which is transmitted to the replacement memory address inputs within 10 nanoseconds of the main memory address having been loaded in the PCM's data registers and data latches.

28. The memory system of claim 22, wherein certain valid combinations of timing signals generated by the host computer system control both main memory cycle type and main memory cycle timing, and wherein certain invalid combinations of the same timing signals generated by a tester are decoded by the PCM as commands to switch PCM operational modes.

29. The memory system of claim 22, wherein the host computer system has a read-only memory that is operatively coupled to both the system main memory address bus and the system data bus, and switching of PCM operational modes may be accomplished by receipt by a particular data byte from the system data bus which the host computer system attempts to write to a read-only memory location.

30. The memory system of claim 29, wherein switching of PCM operational modes also requires receipt by the PCM from the system data bus of a fixed sequence of key data bytes which the host computer system attempts to write to the read-only memory location.

31. The memory system of claim 23, wherein said host computer system has a read-only memory that is operatively coupled to both the system main memory address bus and the system data bus, the PCM being switchable to a write operational mode by an attempted writing of a string comprising a fixed sequence of key data bytes and at least one write command byte to at least one storage location within the read-only memory, said write operational mode enabling the host computer system to write updating data bytes to the non-volatile memory through the PCM in order to add address and failure mode data for storage locations within the main memory which become defective after the memory system is placed in service within the host computer system.

32. The memory system of claim 31, wherein each updating data byte written to update the non-volatile memory is appended to the string.

33. The memory system of claim 31, wherein the defective address and failure mode data within the non-volatile memory may be updated by the host computer system without removal of any components of the memory system from the host computer system.

34. The memory system of claim 22, wherein said main memory has at least one defective storage location.

35. The memory system of claim 25, wherein individual CARs within the PCM are organized as adjacent pairs, and any CAR may be loaded with data which identifies a single address and which also identifies whether that single address is the beginning address of a defective row or the beginning address of a defective column within the main memory.

36. The memory system of claim 35, wherein each row and column address corresponding to a random defective storage location within the main memory is loaded in both CARs of a single pair, the row portion of the address being loaded in one of the CARs of the pair, the column portion of the address being loaded in the other CAR of the pair, and data stored in the CAR containing either the row or the column address portion indicating that both CARs of the pair are cross-linked and that a random defective address is found in both CARs of the pair.

37. The memory system of claim 25, wherein neither partitioning nor specialized allocation of the CAR pairs is required for the loading of data related to the address and failure mode of defective rows or defective columns or defective random locations within the main memory.

38. The memory system of claim 25 wherein a single register is required to specify either a column or a row address, while a sequential register pair is required to specify a random location.

39. The memory system of claim 25, wherein a register is loaded with control bits which specify whether the balance of the register contents point to a row address or a column address or whether the contents of the present register should be combined with the contents of the next addressable register to specify a random address, said random address being specified by both a row address and a column address.

40. The memory system of claim 39, wherein the control bits also specify whether a register is active or inactive, an active register participating in address comparisons, an inactive register not participating in address comparisons.

41. The memory system of claim 25, wherein CARs are sequentially numbered and a replacement address for a defective row is assembled from the column portion of an incoming defective address and the number of the CAR which contains data which identifies the column portion of the incoming address as being defective and a replacement address for a defective column is assembled from the row portion of an incoming defective address and the number of the CAR which contains data which identifies the row portion of the incoming address as being defective.

42. The memory system of claim 41, wherein a replacement address for a defective random location is assembled from the number of one of the CARs of the CAR pair which contains data identifying the incoming address as being defective.

43. The memory system of claim 36, wherein data related to row and column failures and data related to random failures are not mixed during initial loading of the CAR registers in order to most efficiently allocate CAR pairs.

44. The memory system of claim 22, wherein the PCM is implemented as an application specific integrated circuit.

* * * * *